US007209352B2

(12) United States Patent
Chen

(10) Patent No.: US 7,209,352 B2
(45) Date of Patent: Apr. 24, 2007

(54) HEAT DISSIPATION DEVICE INCORPORATING FAN DUCT

(75) Inventor: Chin Hui Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 338 days.

(21) Appl. No.: 10/901,611

(22) Filed: Jul. 28, 2004

(65) Prior Publication Data
US 2005/0041392 A1 Feb. 24, 2005

(30) Foreign Application Priority Data
Aug. 22, 2003 (TW) .............................. 92215275 U

(51) Int. Cl.
*G06F 1/20* (2006.01)
(52) U.S. Cl. ..................... 361/695; 361/697; 165/80.3; 165/120; 415/213.1; 415/178
(58) Field of Classification Search ................ 361/695, 361/697; 165/120–126, 80.3; 415/177, 415/178, 213.1, 214.1
See application file for complete search history.

(56) References Cited

U.S. PATENT DOCUMENTS 5,936,836 A * 8/1999 Scholder ..................... 361/695
6,400,568 B1 * 6/2002 Kim et al. ................... 361/697
6,404,630 B1    6/2002 Lai
6,442,024 B1 * 8/2002 Shih ........................... 361/695
6,462,948 B1 * 10/2002 Leija et al. .................. 361/697
6,504,718 B2 * 1/2003 Wu ............................ 361/695
2002/0134531 A1 * 9/2002 Yanagida .................... 165/80.3
2003/0002254 A1 * 1/2003 Faneuf et al. ............... 361/687
2004/0004812 A1 * 1/2004 Curlee et al. ............... 361/687

FOREIGN PATENT DOCUMENTS

CN            2391306 Y        8/2000

* cited by examiner

*Primary Examiner*—Lisa Lea-Edmonds
(74) *Attorney, Agent, or Firm*—Wei Te Chung

(57) ABSTRACT

A heat dissipation device includes two heat sinks (30) mounted on two electronic components (16) which is mounted within a server (10), two fans (40) mounted on a mounting plate (14) of the server facing the heat sinks for blowing cooling air to the heat sinks, and a fan duct (20). The fan duct includes a top plate (24), a pair of side plates (22) extending from opposite sides of the top plate, a pair of partition walls (26) extending from a middle portion of the top plate, and a stop wall (264) connected between ends of the partition walls. The fan duct is hermetically connected to the mounting plate and the bottom plate thereby cooperatively forming a sealed passage therebetween. The passage includes an inlet (28) adjacent the fans and two separate outlets (29) between the side plates and the partition walls respectively for accommodating the heat sinks therein.

11 Claims, 3 Drawing Sheets

HEAT DISSIPATION DEVICE INCORPORATING FAN DUCT

BACKGROUND OF THE INVENTION

1. Field of the Invention

The present invention relates to a fan duct, and particularly to a fan duct corresponding to a plurality of heat sinks.

2. Related Art

Electronic devices such as central processing units (CPUs) frequently generate large amounts of heat during normal operation, which can destabilize operation and cause damage. Oftentimes, a heat dissipation assembly is used to dissipate heat from the electronic device. The heat dissipation assembly frequently comprises a fan facilitating removal of heat from the electronic device.

Conventionally, a heat sink is mounted on a CPU inside a computer system The fan is directly mounted on the heat sink. The fan generates currents of air flowing through the heat sink, causing heat to be dissipated into the surrounding air. However, in some special computer systems, space for the heat dissipation assembly is limited. So, a kind of heat dissipation assembly incorporating a heat sink and a fan which is not directly mounted on the heat sink is developed. This kind of heat dissipation assembly frequently uses a fan duct connected between the fan and the heat sink for guiding air flow from the fan to the heat sink.

However, with more and more electronic components installed within a computer system, more and more heat sinks and fans are needed. It becomes complicated and costly to mount a fan duct for each combination of a heat sink and a fan with the computer system.

SUMMARY OF THE INVENTION

Accordingly, an object of the present invention is to provide a heat dissipation device incorporating a fan duct which can guide air flow to a plurality heat sinks.

To achieve the above-mentioned object, a heat dissipation device in accordance with the present invention comprises two heat sinks mounted on two electronic components which is mounted within a server, two fans mounted on a mounting plate of the server facing the heat sinks for blowing cooling air to the heat sinks, and a fan duct. The fan duct comprises a top plate, a pair of side plates extending from opposite sides of the top plate, a pair of partition walls extending from middle portions of the top plate, and a stop wall connected between ends of the partition walls. The fan duct is hermetically connected to the mounting plate and the bottom plate thereby cooperatively forming a sealed passage therebetween. The passage comprises an inlet adjacent the fans and two separate outlets between the side plates and the partition walls respectively for accommodating the heat sinks therein. The partition walls and the stop wall can prevent cooling air flow from the fans leaking from space between the heat sinks and prevent producing turbulent flow at the outlets of the fan duct.

Other objects, advantages and novel features of the present invention will be drawn from the following detailed description of preferred embodiment of the present invention with attached drawings, in which:

DESCRIPTION OF THE PREFERRED EMBODIMENT

Figure 1:
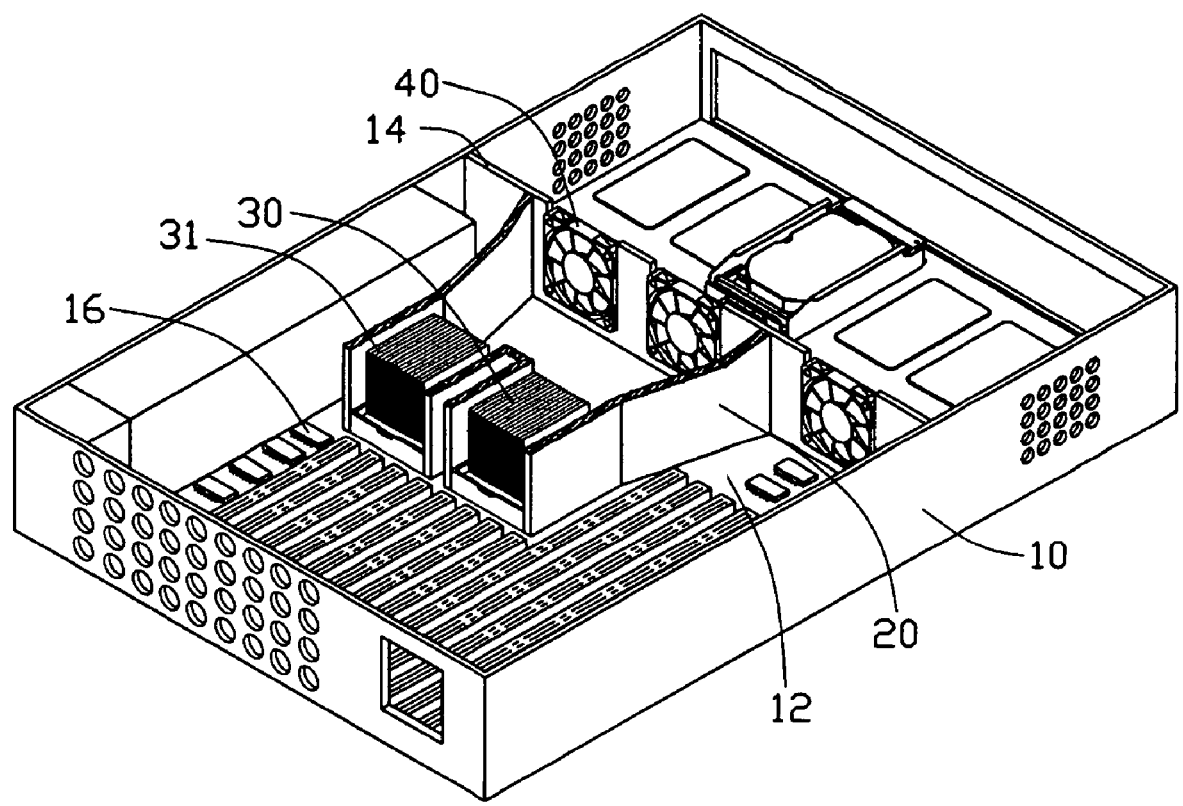
FIG. 1 shows a heat dissipation device in accordance with the present invention within a server, with one portion of a fan duct of the heat dissipation device cutaway.

Referring to the attached drawings, FIG. 1 shows a heat dissipation device in accordance with the present invention within a server 10. The server 10 comprises a bottom plate 12 and a mounting plate 14 extending perpendicularly from the bottom plate 12. The server 10 has a plurality of electronic components 16, such as: wafers, installed on a printed circuit board of the bottom plate 12.

The heat dissipation device comprises a pair of heat sinks 30, a fan duct 20, and a pair of fans 40. The pair of heat sinks 30 are mounted on a pair of respective wafers 16. The heat sink 30 comprises a plurality of fins defining a plurality of channels 31 therebetween. The pair of fans 40 are mounted on the mounting plate 14 aligning with the respective heat sinks 30.

Figure 2:
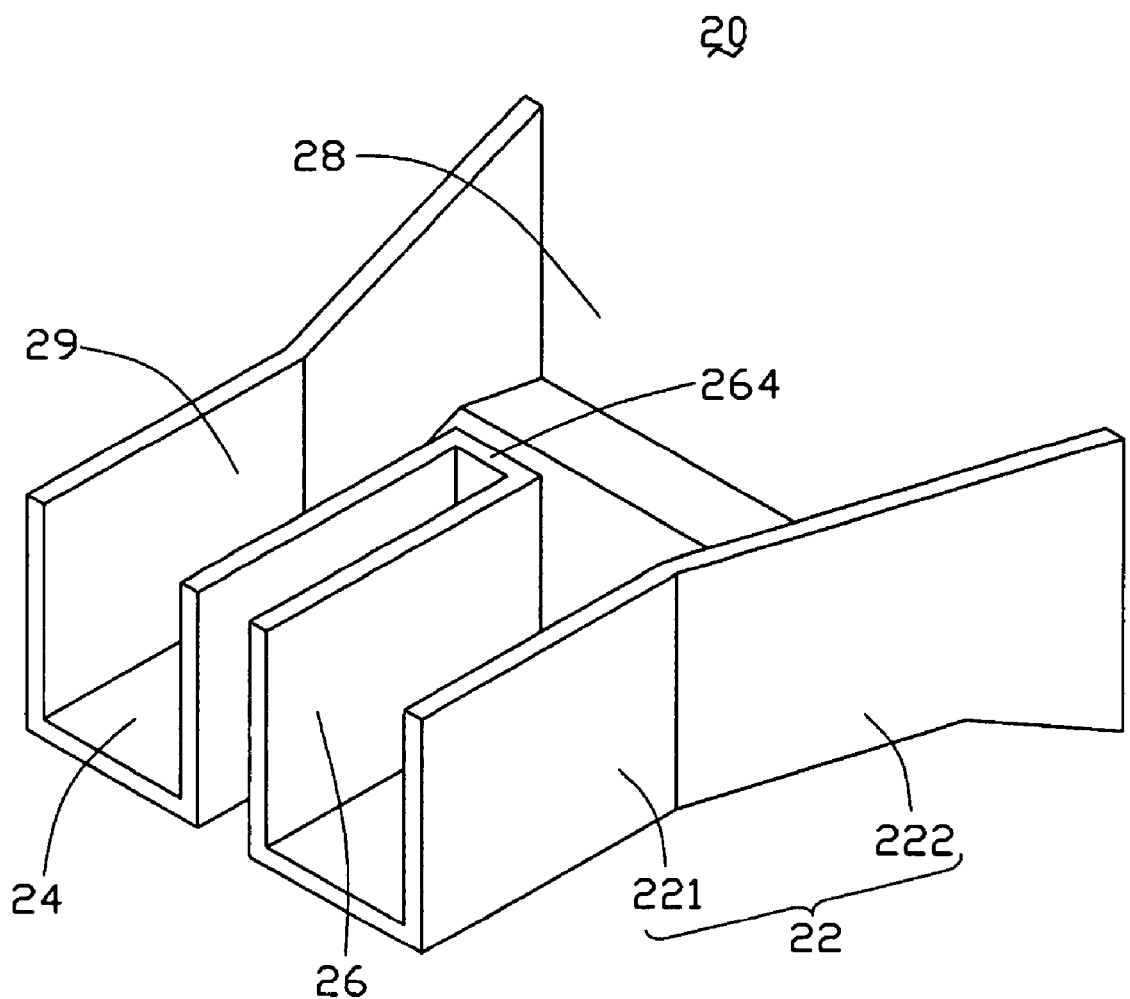
FIG. 2 is an enlarged inverted view of the fan duct of FIG. 1.
Figure 3:
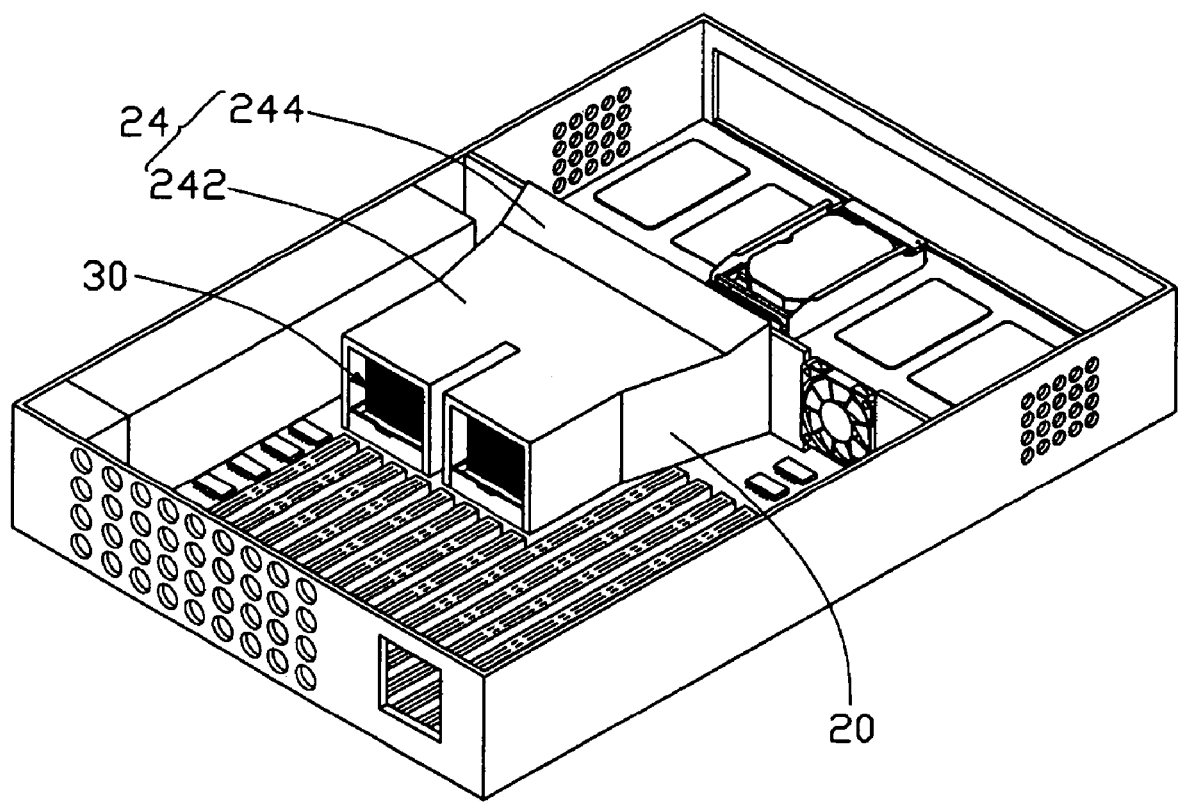
FIG. 3 is similar to FIG. 1 but without the portion of the fan duct cutaway.

Referring to FIGS. 2 and 3, the fan duct 20 comprises a top plate 24, a pair of side plates 22 extending perpendicularly from opposite side edges of the top plate 24, and a pair of spaced partition walls 26 extending perpendicularly from a middle portion of the top plate. Each side plate 22 comprises a straight portion 221 and a slant portion 222 extending outwardly from the straight portion 221. The top plate 24 comprises a straight portion 242 and a slant portion 244 extending from the straight portion 242. A stop wall 264 is connected between ends of the partition walls 26. The top plate 24 and the side plates 22 corporately forming a passage. The passage comprises an inlet 28 adjacent the slant portion 244 of the top plate 24 and a pair of separate outlets 29 between the partition walls 26 and the straight portions 221 of the side plates 22 respectively. The slant portion 244 of the top plate 24 and the slant portions 222 of the side plates 22 are hermetically connected to the mounting plate 14. Bottom edges of the side plates 22 of the fan duct 20 are hermetically connected to the bottom plate 12 of the server 10. The passage of the fan duct 20 therefore become a sealed passage between the fan duct 20, the bottom plate 12 and the mounting plate 14. The inlet 28 of the passage communicates with the fans 40 and the outlets 29 of the passage each accommodate a corresponding heat sink 30 therein. The channels 31 of the heat sink 30 are aligned with the passage at the outlets 29.

In operation, outside cooling air flowing from the fans 40 passes through the air inlet 28 to blow to the heat sinks 30 within the outlets 29 of the fan duct 20. Heat accumulated on the heat sinks 30 absorbing from the wafers 16 is therefore dissipated by cooling air flowing through the channels 31 of the heat sinks 30.

In the present invention, the fan duct 20 corresponds to two combinations of the heat sink 30 and the fan 40, thereby reducing cost and assembly time compared to prior arts in which a fan duct corresponds to a combination of a heat sink and a fan. The partition walls 26 and the stop wall 264 can prevent cooling air flow from the fans 40 leaking from space between the heat sinks 30 and prevent producing turbulent flow at the outlets 29 of the fan duct 20.

In an alternative embodiment, the fan duct 20 can comprises a plurality of outlets 29 for accommodating a plurality of heat sinks 30 therein.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An electronic device assembly comprising: an enclosure having a bottom plate and a mounting plate located on the bottom plate, a plurality of electronic components mounted on the bottom plate;
   at least two heat sinks mounted on two of the electronic components, each heat sink defining a plurality of channels; one fan mounted on the mounting plate facing the at least two heat sinks for blowing cooling air to the at least two heat sinks; and
   a fan duct hermetically connected to the mounting plate and the bottom plate thereby cooperatively forming a sealed passage therebetween, the passage comprising an inlet adjacent the fan and at least two separate outlets accommodating the at least two heat sinks therein with the channels parallel to the passage at the at least two outlets, wherein the fan duct comprises a top plate and a pair of side plates depending from opposite sides of the top plate, bottom edges of the side plates being hermetically attached to the bottom plate of the enclosure, ends of the top plate and the side plates at the inlet being hermetically attached to the mounting plate; the fan duct further comprises a partition member formed between the at least two separate outlets, and the partition member comprises a pair of partition walls extending from the top plate and a stop wall connected between ends of the partition walls adjacent the inlet.

2. The electronic device assembly as claimed in claim 1, wherein each of the side plates comprise a straight portion parallel to the partition walls and a slant portion extending outwardly from the straight portion to the inlet, the top plate, the straight portion of the side plate and an adjacent one of the partition walls cooperatively forming a corresponding outlet.

3. The electronic device assembly as claimed in claim 2, wherein the partition walls are spaced.

4. The electronic device assembly as claimed in claim 1, wherein the top plate comprises a straight portion away from the mounting plate and a slant portion hermetically attached to the mounting plate at the inlet.

5. A fan duct comprising:
   a top plate; and
   a pair of side plates extending from opposite sides of the top plate, wherein
   an air passage is formed between the top plate and the side plates and comprises an inlet for facing a fan and at least two separate outlets for accommodating at least two heat sinks therein, wherein the top plate comprises a straight portion away from the inlet and a slant portion at the inlet.

6. The fan duct as claimed in claim 5, further comprising at least one partition member formed between the at least two separate outlets.

7. The fan duct as claimed in claim 6, wherein the at least one partition member comprises a pair of partition walls extending from the top plate and a stop wall connected between ends of the partition walls adjacent the inlet.

8. The fan duct as claimed in claim 7, wherein the partition wails are spaced.

9. The fan duct as claimed in claim 8, wherein each of the side plates comprise a straight portion parallel to the partition walls at the at least two outlets and a slant portion extending outwardly from the straight portion and hermetically attached to the mounting plate, the top plate, the straight portion and an adjacent one of the partition walls cooperatively forming a corresponding outlet.

10. An electronic device assembly comprising:
    an enclosure having a bottom plate with a printed circuit board thereon;
    a plurality of electronic components mounted on the printed circuit board;
    at least one fan assembly located on one side of the bottom plate and defining an air path parallel to the bottom plate;
    at least two heat sinks mounted on two of the electronic components and confronting said at least one fan assembly in a horizontal direction parallel to said bottom plate; and
    a fan duct having a top wall and two sides walls with one unsealed bottom face and one open front face, a rear end of the fan duct contacting the fan assembly, the unsealed bottom face directly seated upon the printed circuit board, thus commonly forming a horizontal hermetical air passage; wherein
    said fan duct defines a divider to separate an air flow blown from the fan assembly into two individual paths directing to the corresponding heat sinks, respectively; and wherein
    each of the two sides walls extends slantingly upwardly at its rear end to the fan assembly, and the top wall is slantingly upwardly at its rear end to the fan assembly, so that air is directed toward said at least two heat sinks.

11. The assembly as claimed in claim 10, wherein said divider is located on a front portion of said fan duct and close to said two heat sinks.

* * * * *